US009550665B2

(12) United States Patent
Barker

(10) Patent No.: US 9,550,665 B2
(45) Date of Patent: Jan. 24, 2017

(54) MULTI-PHASED MEMS PLATE LOWERING AND LIFTING SYSTEM AND METHOD

(71) Applicant: Texas Instruments Incorporated, Dallas, TX (US)

(72) Inventor: Paul G. Barker, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 185 days.

(21) Appl. No.: 14/488,616

(22) Filed: Sep. 17, 2014

(65) Prior Publication Data
US 2016/0075548 A1 Mar. 17, 2016

(51) Int. Cl.
H01G 9/16 (2006.01)
B81B 3/00 (2006.01)
H01G 5/16 (2006.01)
H02N 1/00 (2006.01)

(52) U.S. Cl.
CPC ............. B81B 3/0013 (2013.01); H01G 5/16 (2013.01); H02N 1/006 (2013.01)

(58) Field of Classification Search
CPC ....................................................... H01G 5/16
See application file for complete search history.

(56) References Cited

U.S. PATENT DOCUMENTS 6,307,452 B1 * 10/2001 Sun .................... H01H 59/0009
333/262
6,661,069 B1 12/2003 Chinthakindi et al.
2007/0279729 A1 * 12/2007 Kothari ................ G02B 26/001
359/291
2013/0301101 A1 * 11/2013 Conrad ............... G02B 26/0841
359/221.2
2014/0307361 A1 * 10/2014 Kahmen ................... B81B 7/00
361/290

OTHER PUBLICATIONS

Radio frequency microelectromechanical system (RF MEMS) acronym, from Wikipedia, pp. 1-12.

* cited by examiner

Primary Examiner — Dion R Ferguson
(74) Attorney, Agent, or Firm — Michael A. Davis, Jr.; Charles A. Brill; Frank D. Cimino

(57) ABSTRACT

A MEMS device includes a bottom plate structure supporting a conductive electrode. A flexible conductive top plate movably supported by a flexure is affixed to a small peripheral portion of the top plate that is aligned with the electrode. Drive circuitry applies a high level of a drive voltage signal between the electrode and the top plate to produce an attracting electrostatic force between the top plate and the electrode sufficient to overcome the flexure and draw the top plate against the electrode. The drive circuitry later applies a low level of the drive voltage signal to remove the electrostatic force and allow the flexure to peel the peripheral portion away from the electrode. Additional drive voltage signals may be applied to additional electrodes to draw additional peripheral portions of the top plate against the additional electrodes and successively removed to allow peripheral portions of the top plate to be sequentially peeled away from the electrodes.

26 Claims, 4 Drawing Sheets

MULTI-PHASED MEMS PLATE LOWERING AND LIFTING SYSTEM AND METHOD

BACKGROUND OF THE INVENTION

The present invention relates generally to improved structures and methods for overcoming stiction forces in MEMS (Micro-Electromechanical Systems) devices. More particularly, the invention relates to structures and methods for reducing the amount of force required to overcome the stiction forces in a MEMS device that tend to cause a movable plate to stick to a stationary plate in the MEMS device, in order to allow the movable plate to be more easily pulled away from the stationary plate.

A "gap-closing" MEMS device generally includes two conducting parallel plates, where one plate (e.g., the bottom plate) is fixed to the substrate and the other plate (e.g., the top plate) is suspended by a spring or elastic suspension element and is free to move. Generally, an electrostatic drive electrode is located underneath the top plate, providing electrostatic attraction force in response to an applied DC drive voltage in order to pull the top plate down toward the bottom plate. A solid dielectric typically is deposited on the bottom plate to prevent the bottom plate from being electrically shorted to the top plate. In the case of a MEMS varactor, there also is an RF "signal electrode" plate underneath the top plate which may have a high-voltage RF signal applied to it. When the top plate and bottom plate are drawn together such that only the solid dielectric separates them, the varactor capacitance between the top plate and the RF electrode plate has its maximum value, and when the top plate is lifted away from the bottom plate, the varactor capacitance is reduced.

FIG. 1 shows the basic structure of a conventional MEMS varactor 1 in which a conductive bottom plate 4 is disposed on an insulating substrate 2. In FIG. 1, substrate 2 would typically be an insulating layer on which the MEMS device is fabricated. A conductive upper or top plate 8 and conductive plate 4 form the electrostatic "pull-in" mechanism that pulls top plate 8 down toward bottom plate 4. Top plate 8 and the conductive co-planar waveguide section labeled CPW form the varactor. A dielectric layer typically is formed on bottom plate 4. The conductive, movable top plate 8 is supported at each end above conductive substrate 2 and bottom plate 4 by means of suitable spring or elastic flexure structures 10A and 10B so that top plate 8 is parallel to both bottom plate 4 and co-planar waveguide CPW. The varactor capacitance is a function of the distance or gap between the upper surface of coplanar waveguide CPW and the lower surface of top plate 8. A suitable DC drive voltage can be applied between bottom plate 4 and top plate 8 so that the resulting electrostatic attraction between conductive plates 4 and 8 overcomes the force of spring or flexure structures 10A and 10B and reduces the gap between them, thereby increasing the varactor capacitance.

It should be understood that an RF signal applied between top plate 8 and co-planar waveguide CPW also produces an RF electrostatic attraction force. That RF electrostatic attraction force combines with the above-mentioned stiction forces and increases the net force holding top plate 8 tightly against the bottom plate 4. It should be understood that because top plate 8 and co-planar waveguide CPW will attract to each other with either a positive or negative voltage difference between them, the MEMS device in effect creates a rectifying action on an applied AC signal such that there is, in effect, an average DC voltage pulling top plate 8 and co-planar waveguide CPW together even though the electric field between them is switching between positive and negative polarities. This is a problem when upper plate 8 is being held by stiction forces against dielectric layer 4A (or conductive electrode 4) and then the DC drive voltage between upper plate 8 and lower electrode 4 is removed in an attempt to decrease the varactor capacitance by releasing upper plate 8 from the stiction forces and raising it relative to conductive substrate 2. (Stiction forces for MEMS devices are well known and are mainly caused by Van der Waals forces, dielectric charging, and other lesser effects. The stiction is a force that holds two metal plates together once they are touching, even if there is an insulating layer between them.)

When a strong electrostatic force pulls top plate 8 down to drive electrode 4, relatively large stiction forces occur between top plate 8 and the drive electrode 4 and therefore tend to prevent top plate 8 from returning to its upper location when the DC drive voltage is removed. When the DC drive voltage is removed, the upward restoring force exerted by springs 10A and 10B attempts to pull top plate 8 back up but typically the restoring force is unable to overcome the stiction forces. It should be understood that MEMS devices generally tend to have substantial problems with stiction forces, and the restoring force of the spring or flexure devices 10A,B in FIG. 1 typically are insufficient to overcome the large stiction forces and often it is very difficult to instantaneously pull or separate the entire top plate 8 away from bottom plate 4. As a practical matter, the amount of restoring force required can be substantially more than can be provided by the spring or flexure restoring devices 10A and 10B. Furthermore, the greater the restoring force provided by spring or flexure restoring devices 10A and 10B, the larger the DC drive voltage applied between top plate 8 and bottom plate or drive electrode 4 must be in order to pull upper plate 8 down into contact with driving electrode 4. Typically, the required DC voltage is the range of roughly 30-40 volts.

Ideally, top plate 8 would spring back up to its starting position when the DC drive voltage applied between top plate 8 and drive electrode 4 is removed, but unfortunately what often actually happens is that the stiction forces are too large to allow that to happen.

There is an unmet need for an improved structure and method for reducing the amount of force required to overcome stiction forces causing one MEMS plate to stick to another, to thereby reduce the amount of force required to separate the two MEMS plates.

There also is an unmet need for an improved structure and method for reducing the amount of force required to overcome stiction forces causing one MEMS plate in a MEMS varactor to stick to another MEMS plate.

SUMMARY OF THE INVENTION

It is an object of the invention to provide an improved structure and method for reducing the amount of force required to overcome stiction forces causing one MEMS plate to stick to another, in order to allow the two MEMS plates to be more easily separated.

It is another object of the invention to reduce the amount of voltage required to be applied between two MEMS plates in order to continue holding one of the MEMS plates against the other.

It is another object of the invention to provide an improved structure and method for reducing the amount of force required to overcome stiction forces causing one MEMS plate in a MEMS varactor to stick to another MEMS plate.

Briefly described, and in accordance with one embodiment thereof, the present invention provides a MEMS device that includes a bottom plate structure (14) supporting a conductive electrode (16-1). A flexible conductive top plate (18) movably supported by a flexure (20-1) is affixed to a small peripheral portion of the top plate that is aligned with the electrode. Drive circuitry (29) applies a high level of a drive voltage signal ($V_{ELECTRODE1}$) between the electrode and the top plate to produce an attracting electrostatic force between the top plate and the electrode sufficient to overcome the flexure and draw the top plate against the electrode. The drive circuitry (29) later applies a low level of the drive voltage signal to remove the electrostatic force and allow the flexure to peel the peripheral portion away from the electrode. Additional drive voltage signals ($V_{ELECTRODE2}$, $V_{ELECTRODE3}$, . . . ) may be applied to additional electrodes to draw additional peripheral portions of the top plate against the additional electrodes. Then, by sequencing the release of the drive voltage signals, peripheral portions of the top plate are successively peeled away from the additional electrodes.

In one embodiment, the invention provides a MEMS device (12-1) including a bottom plate structure (14 in FIG. 2A) supporting a conductive first electrode (16-1). A flexible conductive top plate (18) is movably supported by a first spring structure (20-1) affixed to a relatively small first peripheral portion of the top plate (18) that is generally aligned with the first electrode (16-1). Electrode drive circuitry (29) applies a relatively high level of a first drive voltage signal ($V_{ELECTRODE1}$) between the first electrode (16-1) and the top plate (18) to produce an attractive electrostatic force between the top plate (18) and the first electrode (16-1) sufficient to flex the spring structure (20-1) and draw the top plate (18) against the first electrode (16-1). The electrode drive circuitry (29) later applies a relatively low level of the first drive voltage signal ($V_{ELECTRODE1}$) to remove the attractive electrostatic force and allow the first spring structure (20-1) to peel the first peripheral portion away from the first electrode (16-1).

In one embodiment, the top plate (18) includes a plurality of additional peripheral portions, and the bottom plate structure (14) has thereon a plurality of additional conductive electrodes (16-2,3 etc) aligned with the plurality of additional peripheral portions, respectively. The electrode drive circuitry (29) also produces a plurality of additional electrode drive voltage signals ($V_{ELECTRODE2}$, $V_{ELECTRODE3}$, and $V_{ELECTRODE4}$) which result in a plurality of additional corresponding attractive electrostatic forces between the top plate (18) and the plurality of conductive electrodes (16-2,3, etc), respectively, wherein the electrode drive circuitry (29) successively removes the electrode drive voltage signals ($V_{ELECTRODE1}$, $V_{ELECTRODE2}$, $V_{ELECTRODE3}$, and $V_{ELECTRODE4}$) and resulting attractive electrostatic forces. In one embodiment, the MEMS device includes a plurality of additional spring structures (20-2,3 etc) supporting the top plate (18) at the plurality of additional peripheral portions, respectively. In the described embodiments, each spring structure (20-1,2,3 etc.) includes a corresponding flexure.

In one embodiment, the MEMS device includes a conductive varactor plate (22) supported by the bottom plate structure (24 in FIG. 5), wherein the conductive varactor plate (22) and the top plate (18) form an adjustable capacitor.

In the described embodiments, stiction forces cause the top plate (18) to tend to stick to the plurality of electrodes (16-1,2,3 etc.), and restoring forces produced by the plurality of spring structures (20-1,2,3 etc.) are sufficient to break stiction forces between the top plate (18) and the plurality of electrodes (16-12,3 etc) as the attractive electrostatic forces are sequentially removed.

In the described embodiment, each of the plurality of electrode drive voltage signals ($V_{ELECTRODE1}$, $V_{ELECTRODE2}$, $V_{ELECTRODE3}$ and $V_{ELECTRODE4}$) undergoes an abrupt transition from a relatively high voltage level to a relatively low voltage level in order to successively remove corresponding attractive electrostatic forces between the top plate (18) and the plurality of electrodes (16,1,2,3 etc), respectively. The timing of the transitions of the plurality of electrode drive voltage signals ($V_{ELECTRODE1}$, $V_{ELECTRODE2}$, $V_{ELECTRODE3}$, and $V_{ELECTRODE4}$), respectively, is in accordance with a resonance property of the top plate (18). The top plate (18) includes three additional peripheral portions, and three additional conductive electrodes (16-2,3 etc) are supported by the bottom plate (e.g., 14 in FIG. 2A, 24 in FIG. 5), and the electrode drive circuitry (29) produces three successive additional electrode drive voltage signals ($V_{ELECTRODE2}$, $V_{ELECTRODE3}$, and $V_{ELECTRODE4}$), wherein the peripheral portions are located at four corners, respectively, of the top plate (18). Each spring structure (20-1,2,3 etc) has one portion attached to a corresponding peripheral portion of the top plate (18) and an opposed portion attached to a support (6A,6B).

In one embodiment, the invention provides a method for operating a MEMS device (12-1,2), the method including supporting a conductive first electrode (16-1) on a bottom plate structure (14); supporting a flexible conductive top plate (18) at a relatively small first peripheral portion of the top plate (18) that is generally aligned with the first electrode (16-1), by means of a first spring structure (20-1); applying a relatively high level of a first drive voltage signal ($V_{ELECTRODE1}$) between the first electrode (16-1) and the top plate (18) to produce an attractive electrostatic force between the top plate (18) and the first electrode (16-1) sufficient to flex the spring structure (20-1) and draw the top plate (18) against the first electrode (16-1); and applying a relatively low level of the first drive voltage signal ($V_{ELECTRODE1}$) to remove the attractive electrostatic force and thereby allow the first spring structure (20-1) to peel the first peripheral portion away from the first electrode (16-1).

In one embodiment, the top plate (18) includes a plurality of additional peripheral portions, and the method includes supporting a plurality of additional conductive electrodes (16-2,3 etc) on the bottom plate structure (14), the plurality of additional conductive electrodes (16-2,3 etc) being aligned with the plurality of additional peripheral portions, respectively. The method also includes producing a plurality of additional electrode drive voltage signals ($V_{ELECTRODE2}$, $V_{ELECTRODE3}$ and $V_{ELECTRODE4}$) which result in a plurality of additional corresponding attractive electrostatic forces between the top plate (18) and the plurality of conductive electrodes (16-2,3, etc), respectively, wherein the electrode drive circuitry (29) successively removes the electrode drive voltage signals ($V_{ELECTRODE1}$, $V_{ELECTRODE2}$, $V_{ELECTRODE3}$, and $V_{ELECTRODE4}$) and resulting attractive electrostatic forces.

In one embodiment, stiction forces cause the top plate (18) to tend to stick to the plurality of electrodes (16-1,2,3 etc.), and the method includes producing restoring forces, by means of the plurality of spring structures (20-1,2,3 etc), that are sufficient to break the stiction forces between the top plate (18) and the plurality of electrodes (16-12,3 etc) as the attractive electrostatic forces are sequentially removed.

In one embodiment, the method includes causing each of the plurality of electrode drive voltage signals ($V_{ELECTRODE1}$, $V_{ELECTRODE2}$, $V_{ELECTRODE3}$, and $V_{ELECTRODE4}$) to undergo an abrupt transition from a relatively high voltage level to a relatively low voltage level in order to successively remove corresponding attractive forces between the top plate (18) and the plurality of electrodes (16,1,2,3 etc), respectively, wherein timing of the transitions of the plurality of electrode drive voltage signals ($V_{ELECTRODE1}$, $V_{ELECTRODE2}$, $V_{ELECTRODE3}$, and $V_{ELECTRODE4}$), respectively, is in accordance with a resonance property of the top plate (18).

In one embodiment, the method includes supporting a conductive varactor plate (22) on the bottom plate structure (24), the conductive varactor plate (22) and the top plate (18) forming an adjustable capacitor.

In one embodiment, the invention provides a system for operating a MEMS (micro-electromechanical system) device (12-1,2), including bottom plate means (14) for supporting a conductive first electrode (16-1); means (20-1) for supporting a flexible conductive top plate (18) supported at a first relatively small peripheral portion of the top plate (18) that is generally aligned with the first electrode (16-1); means (29) for applying a relatively high level of a first drive voltage signal ($V_{ELECTRODE1}$) between the first electrode (16-1) and the top plate (18) to produce an attractive electrostatic force between the top plate (18) and the first electrode (16-1) that is sufficient to flex the spring structure (20-1) and draw the top plate (18) against the first electrode (16-1); and means (29) for applying a relatively low level of the first drive voltage signal ($V_{ELECTRODE1}$) to remove the attractive electrostatic force and thereby allow the first spring structure (20-1) to peel the first peripheral portion from the first electrode (16-1).

DETAILED DESCRIPTION OF THE PREFERRED EMBODIMENTS

Figure 1:
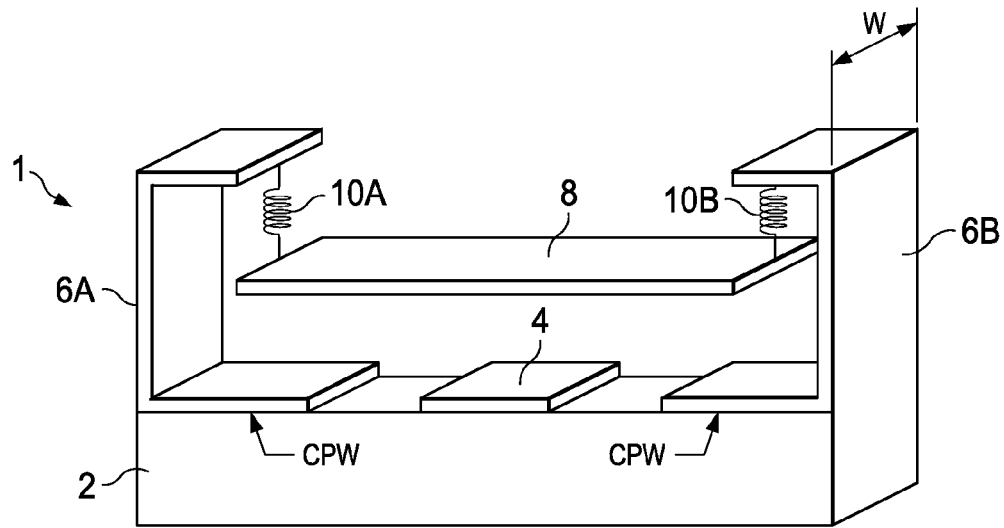
FIG. 1 is a 3-dimensional diagram of a conventional MEMS varactor structure.
Figure 2A:
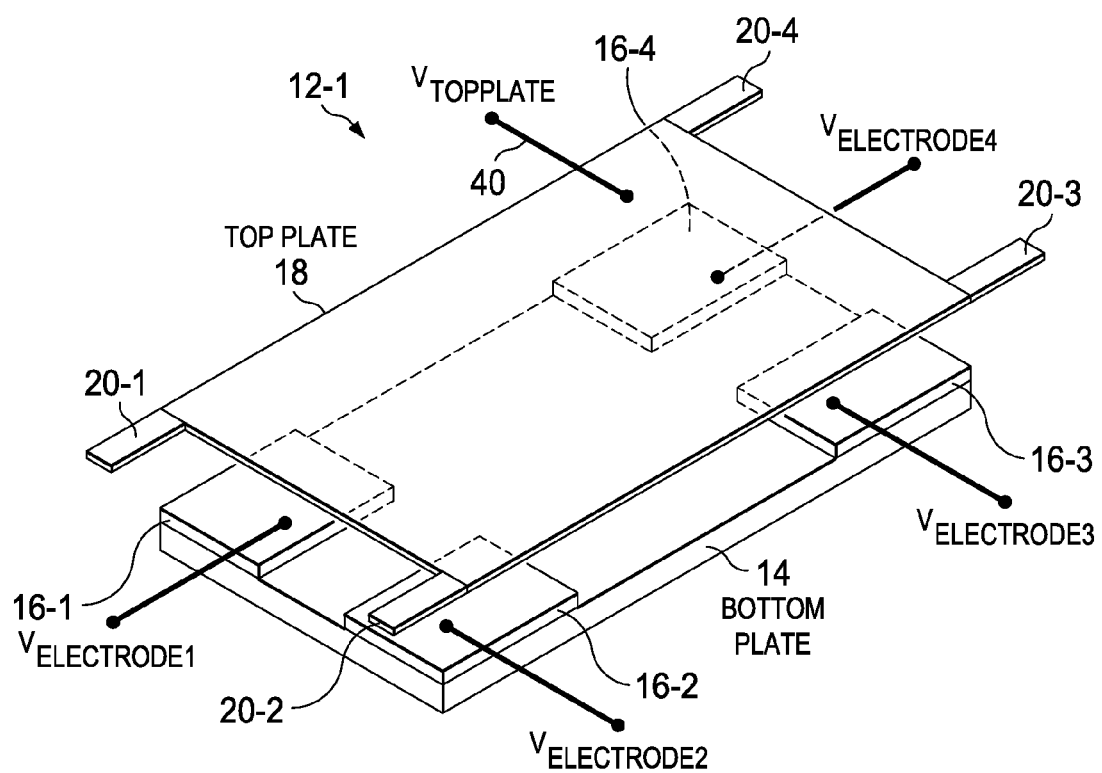
FIG. 2A is a partial 3-dimensional view of a generalized MEMS structure in which phased electrode voltages are successively applied to successive corners of a top plate to accomplish "peeling off" of a flexible, conductive top plate to overcome stiction forces between the top plate and drive electrodes on a bottom plate of the MEMS structure.

FIG. 2A shows an upper isometric view of a generalized MEMS device 12-1 including a fixed or stationary insulative "bottom plate" 14. Four conductive "drive electrodes" 16-1, 16-2, 16-3, and 16-4 are disposed on the corner regions, respectively, of the upper surface of bottom plate 14, as shown. Bottom plate 14 can be attached to (or formed on) a substrate 2, as shown in the side views of FIGS. 2B and 2C. A movable, flexible conductive upper or top plate 18 is supported over stationary bottom plate 14 by means of spring elements or flexure elements 20-1, 20-2, 20-3, and 20-4 which are attached to and extend outwardly from the four corner regions, respectively, of upper plate 18. (By way of definition, the term "spring" herein is intended to encompass various elastic structures or spring structures, such as a flexure or a coil spring.) The outer end portions of flexure elements 20-1 and 20-2 are supported by a stationary or fixed support 6A in FIG. 2B that can be supported by bottom plate 14. Similarly, the outer end portions of flexure elements 20-3 and 20-4 are supported by a stationary or fixed support 6B that can be supported by bottom plate 14 as shown in FIGS. 2B and 2C.

Figure 2B:
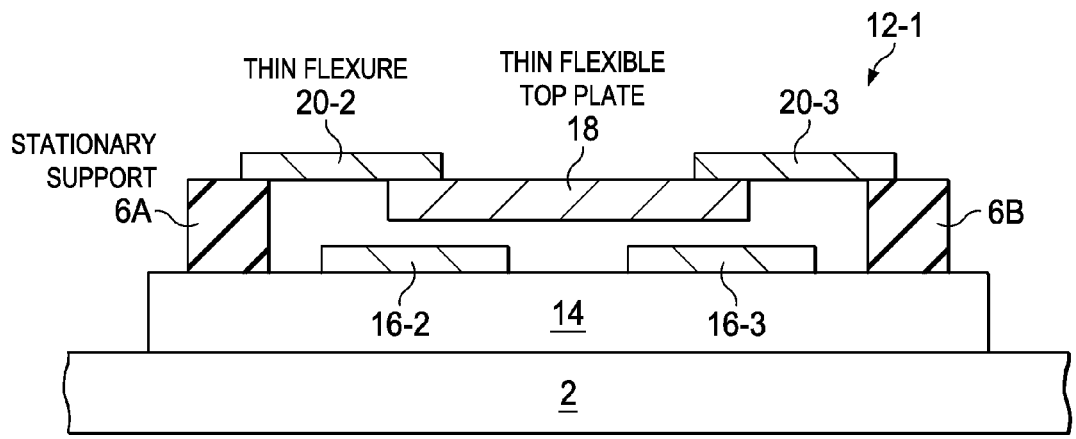
FIG. 2B is a side view of the structure shown in FIG. 2A with the top plate in its highest position.

FIG. 2B shows a more complete front side view, of the structure shown in FIG. 2A and further includes bottom plate 14 and a substrate 2, with flexure elements 20-2 and 20-3 straight and un-flexed so as to support thin flexible top plate 18 at its highest location above metal electrodes 16-2 and 16-3. FIG. 2C shows the same structure as FIG. 2B but with flexure elements 20-2 and 20-3 flexed downward so that the bottom surface of top plate 18 abuts and is stuck by stiction forces to the top surfaces of drive electrodes 16-2 and 16-3.

Figure 3:
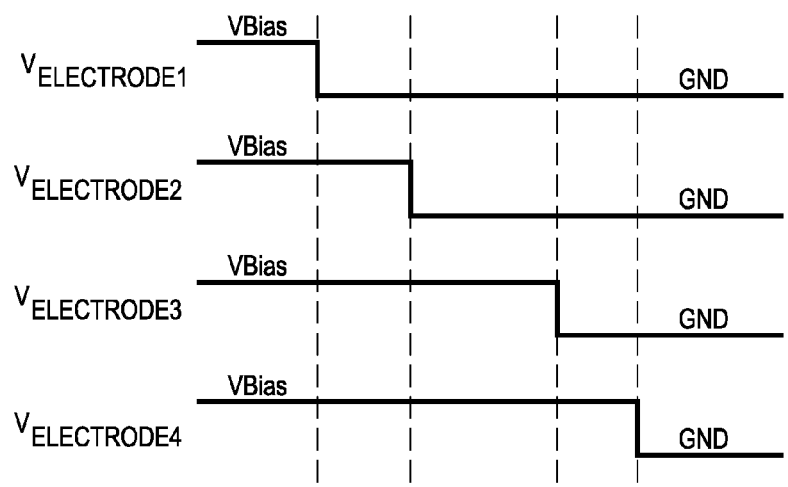
FIG. 3 is a timing diagram that illustrates waveforms of phased electrode voltages that are successively applied to corresponding drive electrodes of the MEMS device shown in FIG. 2A.

During operation, sequential or successive electrode voltages $V_{ELECTRODE1}$, $V_{ELECTRODE2}$, $V_{ELECTRODE3}$, and $V_{ELECTRODE4}$ shown in the timing diagram of FIG. 3 are applied to drive electrodes 16-1, 16-2, 16-3, and 16-4 of MEMS device 12-1, respectively, in order to cause or control raising or releasing of top plate 18 from its lowest or "landing" position (to which conductive top plate 18 has been pulled downward by attractive electrostatic force between top plate 18 and the drive electrodes) at which the bottom surface of top plate 18 inherently "sticks" to the top surface of 14 drive electrodes 16-1, 16-2, 16-3, and 16-4. The time frame for breaking the stiction between top plate 18 and all of the drive electrodes 16-1, 16-2, 16-3, and 16-4 and then lifting top plate 18 to its highest position may be the order of several hundred nanoseconds to a few microseconds, for the release of top plate 18 to occur. This is relatively slow compared to the typical speed of an associated microcontroller or other dedicated circuitry. It should be noted that drive electrodes 16-1,2,3,4 are used only for pulling top plate 18 down.

Figure 2C:
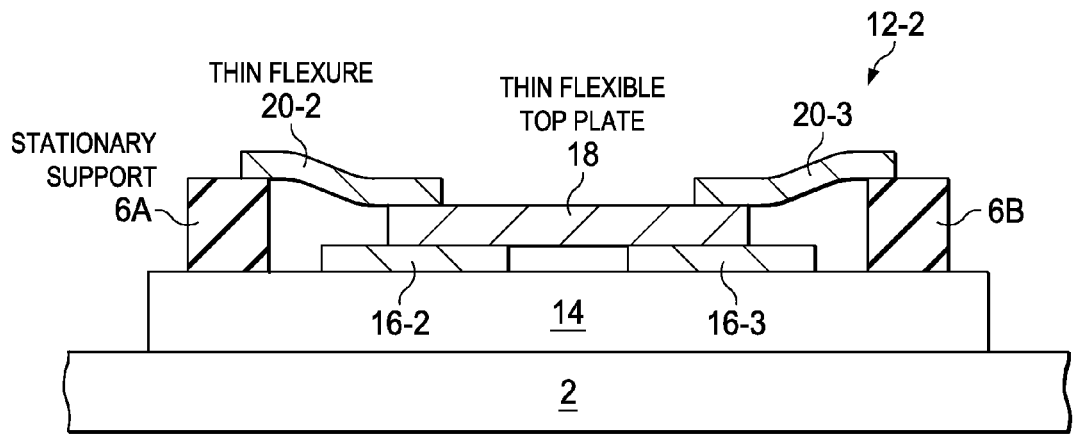
FIG. 2C is a side view of the structure shown in FIG. 2A with the top plate in its lowest position.

It should also be noted that bottom plate 14 in FIGS. 2A-C may be used for various different purposes in various kinds of MEMS devices. For example, in a MEMS varactor a separate conductive plate could be supported by bottom plate 14 to provide the lower plate of a voltage-variable varactor capacitor having top plate 18 as its upper plate.

Top plate 18, flexures 20-1, 20-2, 20-3, and 24-4, and electrodes 16-1, 16-2, 16-3, and 16-4, all could be composed titanium-aluminum material, as could varactor plate 22 of subsequently described FIG. 5. Bottom plate 14 could be composed of high resistivity silicon.

Typically, a MEMS device is fabricated on a MEMS wafer, and associated CMOS circuitry is fabricated on a traditional silicon wafer, and the two are bonded together with the required electrical connection points between them. However, it would be possible to provide CMOS circuitry on the same substrate as a MEMS device.

Preliminary implementations of the described embodiments of the invention, including the generalized MEMS device 12-1 of FIGS. 2A, 2B, and 2C and the MEMS varactor 12-2 of subsequently described FIG. 5 require electrode driving voltages of roughly 30-40 volts to be applied between conductive upper plate 18 and the four drive electrodes 16-1, 16-2, 16-3, and 16-4. This voltage range is required in order to provide sufficient electrostatic attraction force between drive electrodes 16-1, 16-2, 16-3, and 16-4 and upper plate 18 to draw it down against the upward force exerted on the electrodes by flexure elements 20-1, 20-2, 20-3, and 20-4, so as to cause upper plate 18 to "land" on electrodes 16-1, 16-2, 16-3, and 16-4 and establish stiction between upper plate 18 and drive electrodes 16-1, 16-2, 16-3, and 16-4. Once the stiction has been established, the magnitude of the DC drive or "pull-down" voltage level between upper plate 18 and drive electrodes 16-1, 16-2, 16-3, and 16-4 can be substantially reduced before the upward force of spring or flexure elements 20-1, 20-2, 20-3, and 20-4 will be sufficient to "break" the stiction and thereby allow flexure elements 20-1,2,3,4 to raise upper plate 18.

After the above-mentioned stiction has been achieved, it must to be overcome by the upward force of the restoring spring elements or flexure elements 20-1, 20-2, 20-3, and 20-4 so as to overcome or "break" the stiction forces between the bottom surface of conductive upper plate 18 and the upper surfaces of electrodes 16-1, 16-2, 16-3, and 16-4.

The conductive metal plate 18 is quite flexible, so the four electrode drive waveform voltages $V_{ELECTRODE1}$, $V_{ELECTRODE2}$, $V_{ELECTRODE3}$, and $V_{ELECTRODE4}$ are applied sequentially to the 4 drive electrodes 16-1, 16-2, 16-3, and 16-4, respectively. The voltage $V_{TOPPLATE}$ applied via conductor 42 top plate 18 can be a reference voltage, such as ground or zero volts. For example, at the instant of the falling edge of $V_{ELECTRODE1}$ on electrode 16-1, the corresponding corner of top plate 18 will be pulled or "peeled" up by flexure element 20-1 while the remaining underside corners of top plate 18 remain "stuck" to the remaining bottom plate electrodes 16-2, 3, 4 until the instants at which the waveforms of $V_{ELECTRODE2}$, $V_{ELECTRODE3}$, and $V_{ELECTRODE4}$, respectively, fall from approximately 30 volts to approximately zero volts.

The stiction-breaking process therefore occurs progressively around the periphery of top plate 18, with much less maximum upward force being applied by flexure elements 20-1, 2, 3, 4 to top plate 18 than would be required if the upward lifting forces of all four flexure elements were to be simultaneously applied to top plate 18 as required by the prior art MEMS devices. In contrast, the phased timing of the falling edges of electrode drive voltages $V_{ELECTRODE1}$, $V_{ELECTRODE2}$, $V_{ELECTRODE3}$, and $V_{ELECTRODE4}$ as shown in FIG. 3 allows a first corner to be initially peeled back, and the peeling then can be "rotated" from that point around the periphery of the top plate 18 to gradually loosen plate 8 from bottom plate 14.

The timing of the four falling edges of electrode drive voltages $V_{ELECTRODE1}$, $V_{ELECTRODE2}$, $V_{ELECTRODE3}$ and $V_{ELECTRODE4}$ (i.e., the timing of reducing electrode drive voltages $V_{ELECTRODE1}$, $V_{ELECTRODE2}$, $V_{ELECTRODE3}$ and $V_{ELECTRODE4}$ from a high voltage level to a low voltage level) can be optimized with respect to a natural frequency or time constant of top plate 18 in accordance with a resonant "wave" in the periphery of top plate 18 as it is pulled away from the stiction between it and the underlying drive electrodes in accordance with the resonance of top plate 18. This can achieve optimum times for occurrences of the falling edges of $V_{ELECTRODE1}$, $V_{ELECTRODE2}$, $V_{ELECTRODE3}$, and $V_{ELECTRODE4}$. Using the foregoing peripheral edge lifting process for top plate 18 can substantially decrease the amount of time required to break the stiction between top plate 18 and the corresponding underlying drive electrode 16-1, 16-2, 16-3, or 16-4 and then lift top plate 18 to its highest position.

Characterizing the time constant or wave propagation properties of flexible top plate 18 may be accomplished by fabricating a suitable number of MEMS structures generally as shown in FIGS. 2A-C and then utilizing a conventional "characterization platform" to "sweep" the timing parameter and observe the response of top plate 18 to determine the optimum times for the falling edges of the $V_{ELECTRODE1}$, $V_{ELECTRODE2}$, $V_{ELECTRODE3}$, and $V_{ELECTRODE4}$ waveforms in FIG. 3. This can result in the most effective, efficient, and rapid breaking of the stiction between top plate 18 and the drive electrodes 16-1, 16-2, 16-3, and 16-4 and the subsequent lifting of top plate 18 to its highest elevation.

The above mentioned "timing parameter" would be the amount of time between each electrode drive voltage undergoing a transition from an active or ON level to an inactive or OFF level and the next corresponding transition of the next electrode drive voltage. For example, one timing parameter value could be the time interval required between the falling edge of the $V_{ELECTRODE1}$ waveform in FIG. 3 and the following edge of the next $V_{ELECTRODE2}$ waveform, and another timing parameter value could be the time interval required between the falling edge of the $V_{ELECTRODE2}$ waveform in FIG. 3 and the following edge of the next $V_{ELECTRODE3}$ waveform, and so forth. A capacitance indicative of the distance of top plate 18 from bottom plate 14 in MEMS device 12-1 FIGS. 2A-C or the capacitance of the MEMS varactor 12-2 in subsequently described FIG. 5 could be observed using a capacitance meter, or in some cases a camera could be used to observe the location of 18 plate if it is visible. (Conventional MEMS characterization platforms tend to be custom systems that provide a programmable way to control the voltages on the MEMS plates and also provide a way to observe and measure features that indicate values of the parameter or parameters being controlled.)

The testing/characterizing structure should provide a range of flexure element forces in order to generate worst-case variations of the stiction forces within the foregoing range. The amount of stiction, once characterized, will be within a predetermined range. The characterization information can, in effect, be "built into" into a microcontroller (e.g., microcontroller 29 in subsequently described FIG. 4) which generates electrode drive signals $V_{ELECTRODE1}$, $V_{ELECTRODE2}$, $V_{ELECTRODE3}$, and $V_{ELECTRODE4}$ and which may also generate and/or receive other signals to and from various terminals of MEMS device 12-1. The microcontroller also could be programmed to allow for future adjustment of the timing parameters to re-optimize or update the electrode drive voltage waveform timing.

Figure 4:
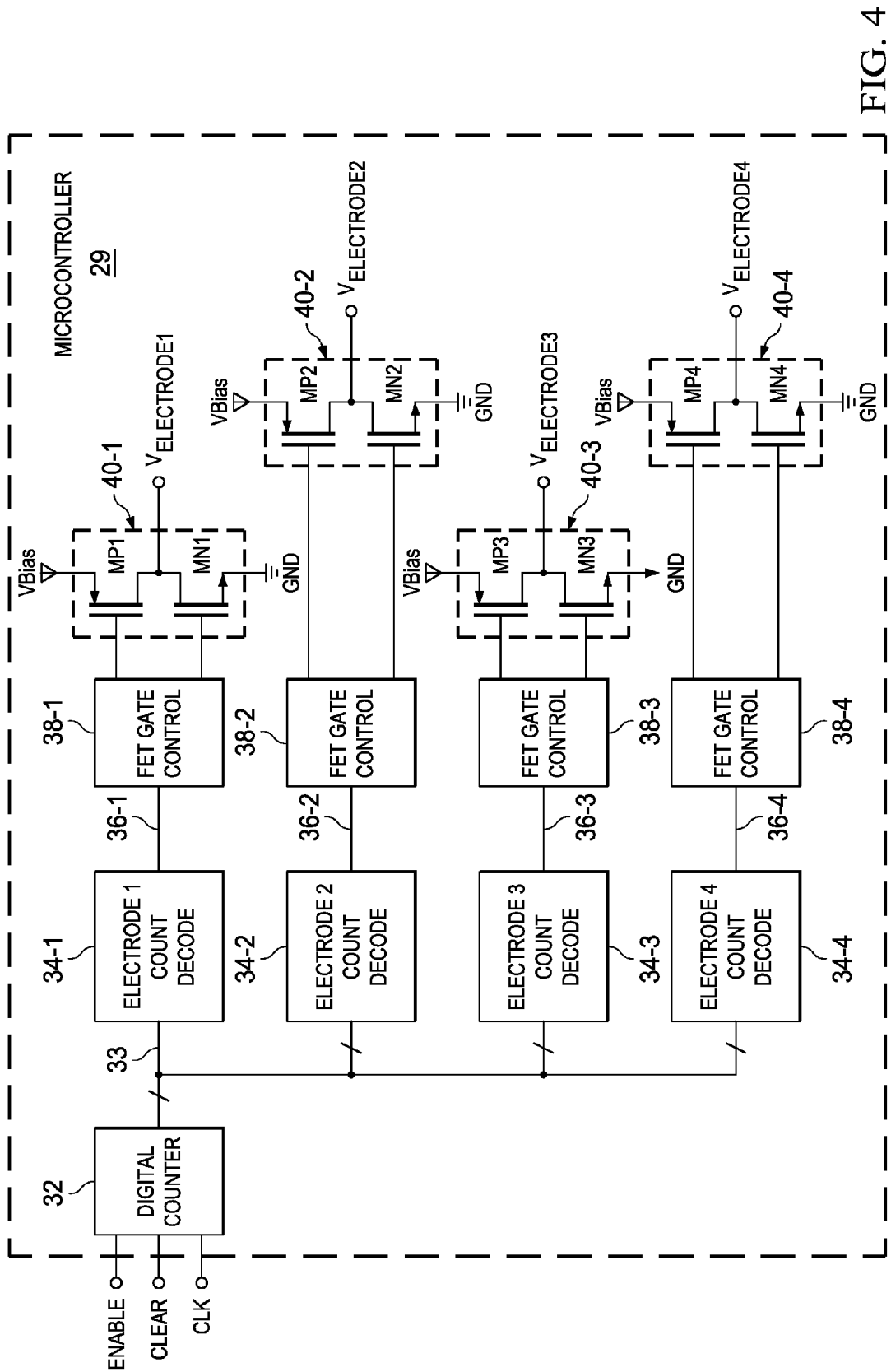
FIG. 4 is a block diagram of a system for generating the electrode voltage waveforms shown in FIG. 3.
Figure 5:
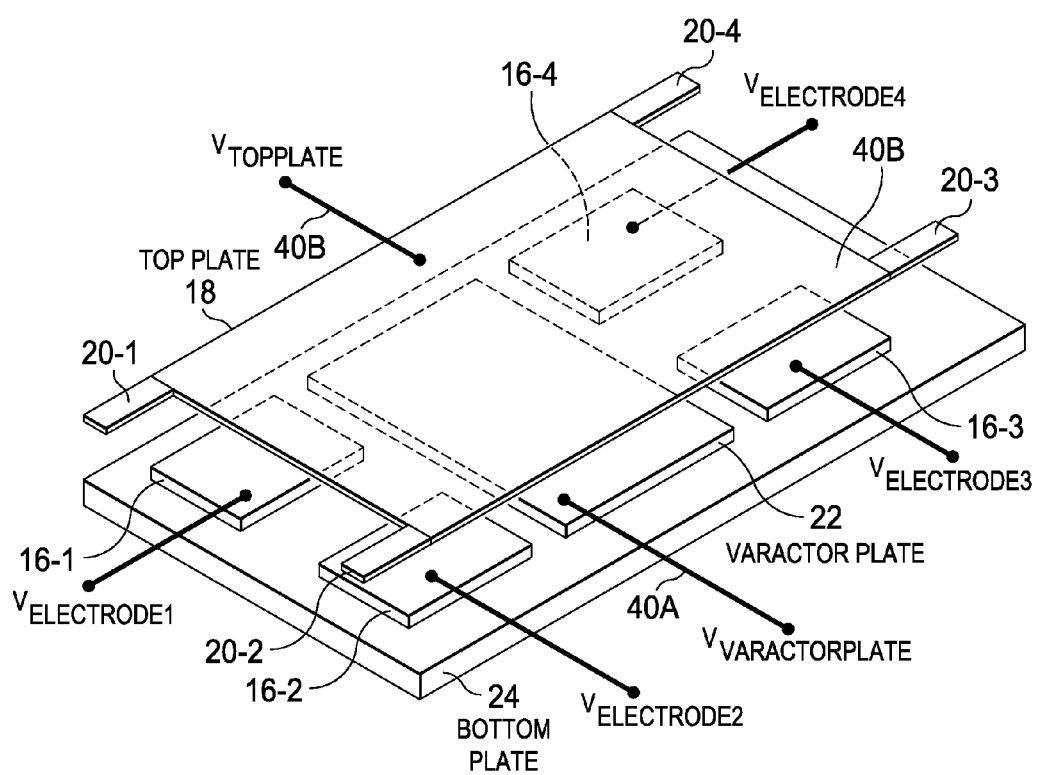
FIG. 5 is a 3-dimensional diagram of a MEMS varactor.

FIG. 4 shows a microcontroller 29 which can be provided in a system including the generalized MEMS structure 12-1 shown in FIGS. 2A-C or the MEMS varactor 12-2 shown in FIG. 5. Microcontroller 29 receives an enable signal ENABLE, a clear or reset signal CLEAR, and a clock signal CLK, and generates the electrode drive signals $V_{ELECTRODE1}$, $V_{ELECTRODE2}$, $V_{ELECTRODE3}$, and $V_{ELECTRODE4}$ in response to the ENABLE, CLEAR, and CLK signals. Microcontroller 29 also includes a digital count decoder 32 which, in response to the ENABLE, CLEAR, and CLK signals, generates a digital signal on bus 33 that corresponds to the time which has elapsed since the previous CLEAR and ENABLE signals. The digital signal on bus 33 continues to be incremented in response to CLK. Microcontroller 29 also includes additional count decoders 34-2, 34-3, and 34-4. All of count decoders 34-1, 34-2, 34-3, and 34-4 receive time-based signals on digital bus 33 and are pre-loaded or programmed to the desired times of the falling edge transitions of electrode drive signals $V_{ELECTRODE1}$, $V_{ELECTRODE2}$, $V_{ELECTRODE3}$, and $V_{ELECTRODE4}$, respectively, from a high or active voltage level VBias to a low or inactive "ground" voltage level GND.

When the present count value in digital counter 32 reaches the programmed value in count decoder 34-1, count decoder 34-1 then generates a signal on conductor 36-1 which is connected to an input of a FET (field effect transistor) gate control circuit 38-1. FET gate control circuit 38-1 provides control signals to an output driver circuit 40-1 which includes a P-channel pull-up transistor MP1 and an N-channel pull-down transistor MN1. FET gate control circuit 38-1 provides separate control signals to the gates of transistors MP1 and MN1. The source of transistor MP1 is connected to VBias, its drain connected to the drain of N-channel pull-down transistor MN1, the source of which is connected to ground. The common drains of transistors MP1 and MN1 are connected to a conductor on which $V_{ELECTRODE1}$ is generated. Similarly, when the count in digital counter 32 reaches the preset or programmed value in count decoder 34-2, then count decoder 34-1 generates a signal on conductor 36-2 as an input to FET gate control circuit 38-2, which provides control signals to the gates of a P-channel pull-up transistor MP2 and a N-channel pull-down transistor MN2 in an output driver circuit 40-2 which has essentially the same structure as output drive circuit 40-1. The electrode drive signals $V_{ELECTRODE3}$ and $V_{ELECTRODE4}$ are generated similarly.

The CLEAR signal, when held at an "active" level, keeps digital counter 32 cleared and forces all four of electrode voltage signals $V_{ELECTRODE1}$, $V_{ELECTRODE2}$, $V_{ELECTRODE3}$, and $V_{ELECTRODE4}$ to be at an ON level of 30 to 40 volts, thereby causing top plate 18 to "land". Switching CLEAR to an "inactive" level near zero volts allows digital counter 32 to start counting CLK pulses. The required phased timing is generated by the programmed or preset count decoders 34-1, 34-2, 34-3, and 34-4 and controls the times at which the subsequent edges or transitions of electrode drive voltages $V_{ELECTRODE1}$, $V_{ELECTRODE2}$, $V_{ELECTRODE3}$ and $V_{ELECTRODE4}$ occur. This in turn causes the corner regions of top plate 18 to be successively peeled away from electrodes 16-1, 16-2, 16-3, and 16-4. The ENABLE signal allows the electrode voltage generation circuitry to be off when not needed, for example in order to save power.

FIG. 5 shows an upper isometric view of a MEMS varactor device 12-2 including a fixed or stationary varactor plate 22 formed on insulative bottom plate 24. As in FIG. 2A, four conductive "drive electrodes" 16-1, 16-2, 16-3, and 16-4 are disposed on the corner regions of the upper surface of bottom plate 24, respectively, as shown. Varactor plate 22 is attached to (or formed on) bottom plate 24. As in FIG. 2A, movable, flexible conductive top 18 is supported over stationary varactor plate 22 by means of spring elements or flexure elements 20-1, 20-2, 20-3, and 20-4 which are attached to and extend outwardly from the four corner regions, respectively, of upper plate 18. The outer end portions of flexure elements 20-1 and 20-2 are supported by a stationary or fixed support, similar to support 6A in FIG. 2B, that can be supported by bottom plate 24. Similarly, the outer end portions of flexure elements 20-3 and 20-4 are supported by a stationary or fixed support, similar to support 6B in FIG. 2B, that can be supported by bottom plate 24.

FIG. 5 shows that varactor plate 22 and drive electrodes 16-1, 16-2, 16-3, and 16-4 are separate and also shows that top plate 18 and varactor plate 22 form an adjustable capacitor, or "varactor capacitor". The four electrodes 16-1, 16-2, 16-3, and 16-4 are used only for electrostatically pulling the top plate 18 down toward drive electrodes 16-1, 16-2, 16-3, and 16-4 and varactor plate 22. Top plate 18 could be connected to a voltage $V_{TOPPLATE}$, which could be an electrical ground signal level to provide a reference voltage so when a 30 to 40 volt bias voltage VBias is applied to electrodes 16-1, 16-2, 16-3 a corresponding electrostatic force is produced between top plate 18 and each of the four drive electrodes 16-1, 16-2, 16-3, and 16-4, respectively, to pull top plate 18 down. Varactor plate 22 is connected to a signal conductor 40A and top plate 18 is connected by conductor 40B to conduct $V_{TOPPLATE}$ as a ground signal or other suitable signal to the upper plate of the varactor capacitor. (Alternatively, varactor plate 22 can be split into two varactor plates (not shown) to form to two varactor capacitors connected in series wherein one of the split varactor plates and top plate 18 form one varactor capacitor and the other split varactor plate and top plate 18 form the other varactor capacitor.)

The use of four separate phased electrode drive signals as described, wherein the voltage on each drive electrode is sharply decreased (in the manner of a step function) with a timing offset that corresponds to a mechanical time constant of the top plate 18 causes one corner or edge portion of the flexible top plate 18 to be pulled or peeled away from the underlying drive electrode before adjacent portions of top plate 18 are peeled away from their underlying drive electrodes. This reduces the maximum initial force required to first break all of the stiction and then lift top plate 18 upward in the embodiments of the invention shown in FIGS. 2A and 5.

A main advantage of the described embodiments of the invention is that they reduce the stiction and RF electrostatic forces (i.e., RF electrostatic forces caused by an average effective DC voltage created by an applied RF signal) tending to hold top plate 18 down against the underlying drive electrodes 16-1, 16-2, 16-3, and 16-4. Since the periphery of top plate 18 can be peeled off corner by corner, the total stiction force (i.e., the sum of all of the electrode stiction forces) does not need to be overcome all at once. Instead, each of flexures 20-1, 20-2, 20-3, and 20-4 needs to exert only a relatively small upward force on its corresponding corner portion of top plate 18. Therefore, the required total amount of stiction force is, in effect, "spread out over time", thereby reducing the maximum instantaneous force needed to break the stiction, completely release top plate 18, and lift it away from all of drive electrodes 16-1, 16-2, 16-3, and 16-4. The described embodiments of the invention accomplish this without significantly affecting other MEMS parameters, such as actuator size, die area, top plate pull-down voltage magnitude, etc. Also, the characteristics of the MEMS device should not be affected much by manufacturing process variability.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the described peeling of top plate 18 could be accomplished with only two electrodes, one for each end of top plate 18 if it is very long and narrow. As another example, non-rectangular or curvi-linear configurations of top plate 18 could be utilized. Also, a software algorithm for simulating the operation of the described microcontroller circuitry including digital counter 32 and count decoders 34-1, 34-2, 34-3, and 34-4, could be readily provided in any other suitable microprocessor or microcontroller.

What is claimed is:

1. A MEMS (micro-electromechanical system) device comprising:
a bottom plate structure supporting conductive electrodes, including at least first, second and third electrodes;
a conductive top plate supported by spring structures affixed to peripheral portions of the top plate, wherein the top plate is generally aligned parallel with the first, second and third electrodes; and
electrode drive circuitry for: applying a first level of a drive voltage signal between the top plate and each of the first, second and third electrodes, to produce an attractive electrostatic force between the top plate and each of the first, second and third electrodes, sufficient to flex the spring structures and draw the top plate against each of the first, second and third electrodes; and sequentially applying a second level of the drive voltage signal between the top plate and successive ones of the first, second and third electrodes, to sequentially remove the attractive electrostatic force between the top plate and successive ones of the first, second and third electrodes sufficient to allow the spring structures to sequentially peel the peripheral portions away from the first, second and third electrodes.

2. The MEMS device of claim 1 wherein each of the spring structures includes a respective flexure.

3. The MEMS device of claim 1 comprising a conductive varactor plate supported by the bottom plate structure, the conductive varactor plate and the top plate forming an adjustable capacitor.

4. The MEMS device of claim 1 wherein stiction forces cause the top plate to tend to stick to the first, second and third electrodes, and wherein restoring forces produced by the spring structures are sufficient to break the stiction forces between the top plate and the first, second and third electrodes as the attractive electrostatic forces are sequentially removed.

5. The MEMS device of claim 1 wherein sequentially applying the second level of the drive voltage signal includes: abruptly transitioning the drive voltage signal from the first level to the second level between the top plate and successive ones of the first second and third electrodes.

6. The MEMS device of claim 1 wherein each of the spring structures has: a respective first portion affixed to a corresponding peripheral portion of the top plate; and a respective second portion affixed to a corresponding support.

7. The MEMS device of claim 5 wherein the transitioning is timed in accordance with a resonance property of the top plate.

8. The MEMS device of claim 1 wherein the conductive electrodes are composed of titanium-aluminum.

9. The MEMS device of claim 1 wherein the top plate is composed of titanium-aluminum.

10. The MEMS device of claim 2 wherein the flexures are composed of titanium-aluminum.

11. The MEMS device of claim 3 wherein the varactor plate is composed of titanium-aluminum.

12. The MEMS device of claim 1 wherein the peripheral portions include at least three corners of the top plate.

13. The MEMS device of claim 12 wherein the three corners of the top plate are respectively aligned with the first, second and third electrodes.

14. The MEMS device of claim 13 wherein the spring structures include at least three spring structures respectively affixed to the three corners of the top plate.

15. A method for operating a MEMS (micro-electromechanical system) device, the method comprising:
applying a first level of a drive voltage signal between a conductive top plate and conductive electrodes, including at least first, second and third electrodes, to produce an attractive electrostatic force between the top plate and each of the first, second and third electrodes, sufficient to flex spring structures affixed to peripheral portions of the top plate and draw the top plate against each of the first, second and third electrodes; wherein the conductive electrodes are supported by a bottom plate structure, the top plate is supported by the spring structures, and the top plate is generally aligned parallel with the first, second and third electrodes; and
sequentially applying a second level of the drive voltage signal between the top plate and successive ones of the first, second and third electrodes, to sequentially remove the attractive electrostatic force between the top plate and successive ones of the first, second and third electrodes, sufficient to allow the spring structures to sequentially peel the peripheral portions away from the first, second and third electrodes.

16. The method of claim 15 wherein stiction forces cause the top plate to tend to stick to the first, second and third electrodes, and wherein restoring forces produced by the spring structures are sufficient to break the stiction forces between the top plate and the first, second and third electrodes as the attractive electrostatic forces are sequentially removed.

17. The method of claim 15 wherein sequentially applying the second level of the drive voltage signal includes: abruptly transitioning the drive voltage signal from the first level to the second level between the top plate and successive ones of the first, second and third electrodes, timed in accordance with a resonance property of the top plate.

18. The method of claim 15 comprising: supporting a conductive varactor plate on the bottom plate structure, the conductive varactor plate and the top plate forming an adjustable capacitor.

19. A MEMS (micro-electromechanical system) device comprising:
a bottom plate structure supporting conductive electrodes, including at least first, second, third and fourth electrodes;
a conductive top plate supported by spring structures affixed to peripheral portions of the top plate, wherein the top plate is generally aligned parallel with the first, second, third and fourth electrodes; and
electrode drive circuitry for: applying a first level of a drive voltage signal between the top plate and each of the first, second, third and fourth electrodes, to produce an attractive electrostatic force between the top plate and each of the first, second, third and fourth electrodes, sufficient to flex the spring structures and draw the top plate against each of the first, second, third and fourth electrodes; and sequentially applying a second level of the drive voltage signal between the top plate and successive ones of the first, second, third and fourth electrodes, to sequentially remove the attractive electrostatic force between the top plate and successive ones of the first, second, third and fourth electrodes, sufficient to allow the spring structures to sequentially peel the peripheral portions away from the first, second, third and fourth electrodes.

20. The MEMS device of claim 19 wherein the peripheral portions include at least four corners of the top plate.

21. The MEMS device of claim 20 wherein the four corners of the top plate are respectively aligned with the first, second, third and fourth electrodes.

22. The MEMS device of claim 21 wherein the spring structures include at least four spring structures respectively affixed to the four corners of the top plate.

23. The MEMS device of claim 19 wherein stiction forces cause the top plate to tend to stick to the first, second, third and fourth electrodes, and wherein restoring forces produced by the spring structures are sufficient to break the stiction forces between the top plate and the first, second, third and fourth electrodes as the attractive electrostatic forces are sequentially removed.

24. The MEMS device of claim 19 wherein sequentially applying the second level of the drive voltage signal includes: abruptly transitioning the drive voltage signal from the first level to the second level between the top plate and successive ones of the first, second, third and fourth electrodes, timed in accordance with a resonance property of the top plate.

25. The MEMS device of claim 19 wherein each of the spring structures has: a respective first portion affixed to a corresponding peripheral portion of the top plate; and a respective second portion affixed to a corresponding support.

26. The MEMS device of claim 19 comprising a conductive varactor plate supported by the bottom plate structure, the conductive varactor plate and the top plate forming an adjustable capacitor.

* * * * *